US012616003B2

(12) United States Patent
  Kim et al.

(10) Patent No.: US 12,616,003 B2
(45) Date of Patent: Apr. 28, 2026

(54) METHOD FOR FABRICATING A SEMICONDUCTOR DEVICE

(71) Applicant: Samsung Electronics Co., Ltd., Suwon-si (KR)

(72) Inventors: Doory Kim, Seoul (KR); Jae Hwang Jung, Suwon-si (KR); Wook Rae Kim, Suwon-si (KR); Nam Yoon Kim, Seoul (KR); Myung Jun Lee, Seongnam-si (KR); SeokRan Go, Seoul (KR); Dokyung Jeong, Gyeongju-si (KR); Uidon Jeong, Seoul (KR)

(73) Assignees: SAMSUNG ELECTRONICS CO., LTD., Suwon-si (KR); IUCF-HYU (INDUSTRY-UNIVERSITY COOPERATION, Seoul (KR)

( * ) Notice: Subject to any disclaimer, the term of this patent is extended or adjusted under 35 U.S.C. 154(b) by 886 days.

(21) Appl. No.: 17/874,450

(22) Filed: Jul. 27, 2022

(65) Prior Publication Data

US 2023/0215769 A1 Jul. 6, 2023

(30) Foreign Application Priority Data

Jan. 3, 2022 (KR) ........................ 10-2022-0000457

(51) Int. Cl.
  H01L 21/66 (2006.01)
  G01N 21/64 (2006.01)
  (Continued)

(52) U.S. Cl.
  CPC ........... H01L 22/12 (2013.01); G01N 21/643 (2013.01); G01N 21/9501 (2013.01); G01N 21/956 (2013.01); *G01N 2021/6439* (2013.01)

(58) Field of Classification Search
  None
  See application file for complete search history.

(56) References Cited

U.S. PATENT DOCUMENTS

| | | | | |
|---|---|---|---|---|
| 4,679,938 A | | 7/1987 | Flamholz | |
| 5,776,748 A | * | 7/1998 | Singhvi | C12N 5/067 |
| | | | | 435/395 |

(Continued)

FOREIGN PATENT DOCUMENTS

| | | |
|---|---|---|
| CN | 105241635 A | 1/2016 |
| JP | 2000111477 A | 4/2000 |

(Continued)

OTHER PUBLICATIONS

Doory Kim, "Material-specific super-resolution imaging of non-patterned wafer," presented at 2021 Next Generation Lithography Conference, Alpensia Convention Center, Pyeong Chang, Korea, Nov. 18, 2021, pp. 1-6.

(Continued)

*Primary Examiner* — Bo B Jang
(74) *Attorney, Agent, or Firm* — Muir Patent Law, PLLC

(57) ABSTRACT

A method for fabricating a semiconductor device is provided. The method for fabricating the semiconductor device includes forming a semiconductor pattern including a first layer and a second layer on a substrate, forming a coating layer on a surface of the first layer, forming a dyeing substance in which one of an antibody or a protein is combined with a fluorophore, attaching the dyeing substance to a surface of the coating layer to form a dyeing layer, and photographing the fluorophore with an ultra-high resolution microscope to detect the semiconductor pattern.

18 Claims, 12 Drawing Sheets

100

(51) Int. Cl.
    *G01N 21/95*      (2006.01)
    *G01N 21/956*    (2006.01)

(56)               References Cited

U.S. PATENT DOCUMENTS

| | | | |
|---|---|---|---|
| 5,866,321 | A | 2/1999 | Matsue et al. |
| 9,075,013 | B2 | 7/2015 | Markle et al. |
| 9,297,768 | B2 | 3/2016 | Yager et al. |
| 9,433,967 | B2 | 9/2016 | Asano |
| 10,830,639 | B2 | 11/2020 | Urban et al. |
| 2010/0112546 | A1* | 5/2010 | Lieber ................ G01N 33/6854 |
| | | | 530/391.1 |
| 2015/0017399 | A1 | 1/2015 | Badyal et al. |
| 2017/0307440 | A1* | 10/2017 | Urban ................ G01N 21/6458 |

FOREIGN PATENT DOCUMENTS

| | | | |
|---|---|---|---|
| JP | 6747690 | B2 | 1/2013 |
| KR | 100891946 | B1 | 8/2008 |
| KR | 1020120018688 | B1 | 5/2012 |
| KR | 1020160056590 | B1 | 5/2016 |

OTHER PUBLICATIONS

Full Program, 2021 Next Generation Lithography Conference, Alpensia Convention Center, Pyeong Chang, Korea, from 2021.ngl. or.kr/wp/sub02_2.asp, printed Dec. 7, 2021, pp. 1-9.

\* cited by examiner

Figure 4:
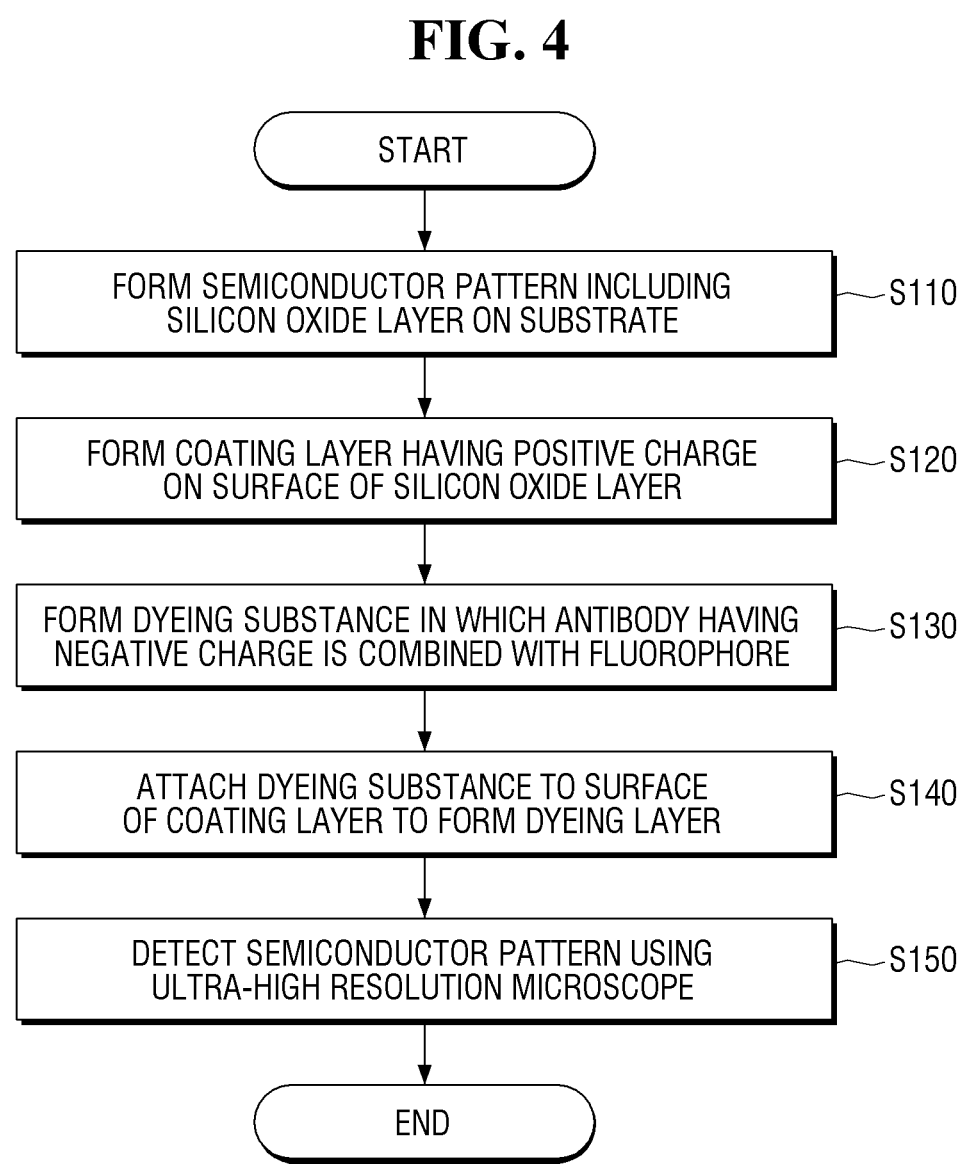

START

FORM SEMICONDUCTOR PATTERN INCLUDING SILICON OXIDE LAYER ON SUBSTRATE —S110

FORM COATING LAYER HAVING POSITIVE CHARGE ON SURFACE OF SILICON OXIDE LAYER —S120

FORM DYEING SUBSTANCE IN WHICH ANTIBODY HAVING NEGATIVE CHARGE IS COMBINED WITH FLUOROPHORE —S130

ATTACH DYEING SUBSTANCE TO SURFACE OF COATING LAYER TO FORM DYEING LAYER —S140

DETECT SEMICONDUCTOR PATTERN USING ULTRA-HIGH RESOLUTION MICROSCOPE —S150

END

Figure 7:
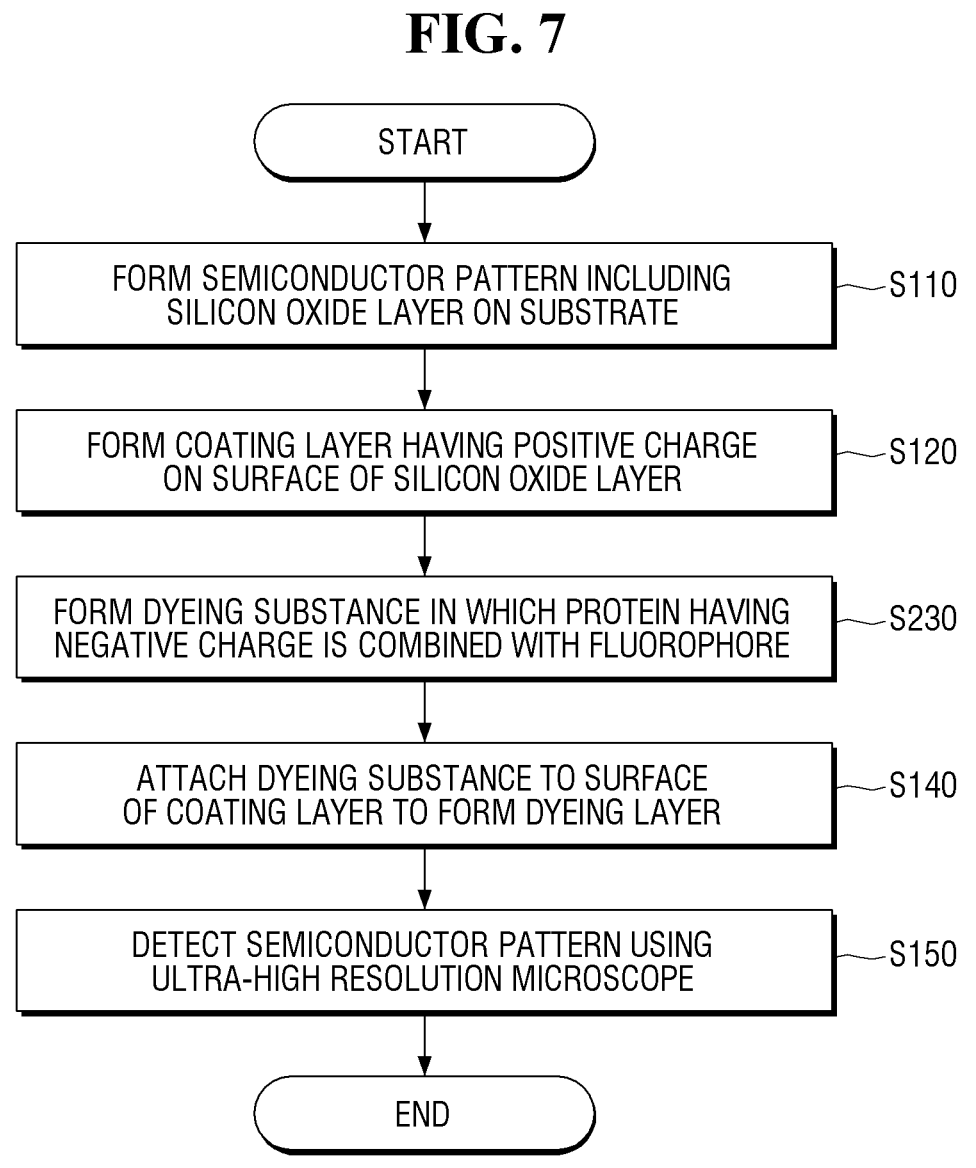

START

FORM SEMICONDUCTOR PATTERN INCLUDING
SILICON OXIDE LAYER ON SUBSTRATE — S110

FORM COATING LAYER HAVING POSITIVE CHARGE
ON SURFACE OF SILICON OXIDE LAYER — S120

FORM DYEING SUBSTANCE IN WHICH PROTEIN HAVING
NEGATIVE CHARGE IS COMBINED WITH FLUOROPHORE — S230

ATTACH DYEING SUBSTANCE TO SURFACE
OF COATING LAYER TO FORM DYEING LAYER — S140

DETECT SEMICONDUCTOR PATTERN USING
ULTRA-HIGH RESOLUTION MICROSCOPE — S150

END

FIG. 9

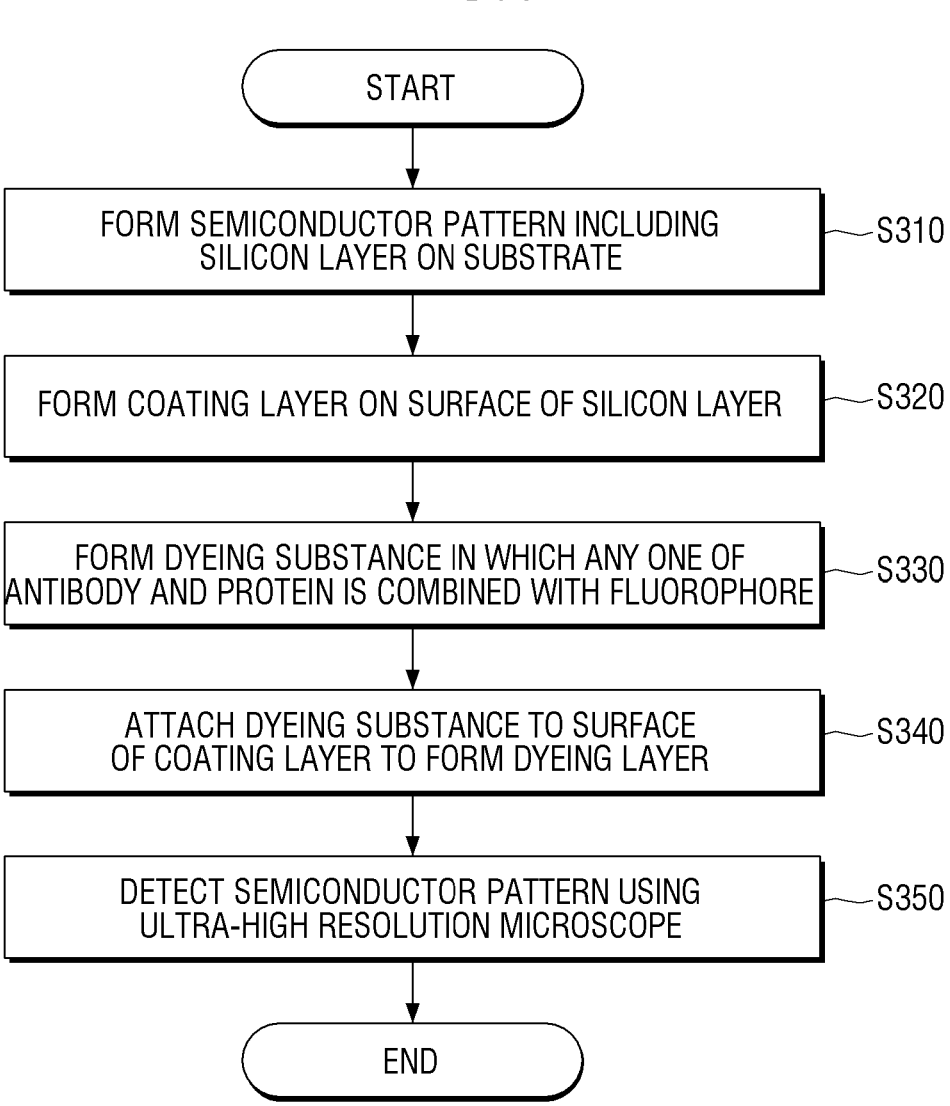

START

FORM SEMICONDUCTOR PATTERN INCLUDING SILICON LAYER ON SUBSTRATE ~S310

FORM COATING LAYER ON SURFACE OF SILICON LAYER ~S320

FORM DYEING SUBSTANCE IN WHICH ANY ONE OF ANTIBODY AND PROTEIN IS COMBINED WITH FLUOROPHORE ~S330

ATTACH DYEING SUBSTANCE TO SURFACE OF COATING LAYER TO FORM DYEING LAYER ~S340

DETECT SEMICONDUCTOR PATTERN USING ULTRA-HIGH RESOLUTION MICROSCOPE ~S350

END

START

FORM SEMICONDUCTOR PATTERN INCLUDING
SILICON LAYER ON SUBSTRATE — S310

FORM HYDROXYL GROUP ON SURFACE OF SILICON LAYER — S420

COMBINE TARGET SUBSTANCE HAVING AMINO GROUP
AS END GROUP TO SURFACE OF SILICON LAYER — S430

ATTACH FLUOROPHORE TO TARGET SUBSTANCE
TO FORM DYEING LAYER — S440

DETECT SEMICONDUCTOR PATTERN USING
ULTRA-HIGH RESOLUTION MICROSCOPE — S350

END 12
11
10

DR3
DR1
DR2

47
12
11
10

DR3
DR1
DR2

METHOD FOR FABRICATING A SEMICONDUCTOR DEVICE

CROSS-REFERENCE TO RELATED APPLICATION

This application claims priority under 35 U.S.C. 119 to Korean Patent Application No. 10-2022-0000457 filed on Jan. 3, 2022 in the Korean Intellectual Property Office, the contents of which in their entirety are herein incorporated by reference.

BACKGROUND

1. Technical Field

The present disclosure relates to a method for fabricating a semiconductor device. Specifically, the present disclosure relates to a method for fabricating a semiconductor device, which includes detection of a semiconductor pattern using an ultra-high resolution microscope.

2. Description of the Related Art

Nowadays, as many digital apparatuses become smaller, more semiconductor devices are placed in a limited space of increasingly small and complex electronic devices. Therefore, there is an increasing need for ultra-highly integrated semiconductors in which a width between lines of a semiconductor circuit is miniaturized to a nanometer level. Importance of circuit imaging of nanometer level components placed inside such semiconductor elements is increasing, and the demand for an inspection apparatus having ultra-high resolution capable of detecting this is increasing.

SUMMARY

Aspects of the present disclosure provide a method for fabricating a semiconductor device capable of effectively detecting a semiconductor pattern of a nanometer level, by selectively attaching a fluorophore to a surface of a layer including a target substance (e.g., silicon oxide ($SiO_2$) or silicon (Si)) using an antibody or protein, and then, by photographing the fluorophore using an ultra-high resolution microscope to detect the semiconductor pattern.

Aspects of the present disclosure also provide a method for fabricating a semiconductor device capable of effectively detecting a semiconductor pattern of a nanometer level, by selectively attaching a fluorophore to a surface of a layer including a target substance (e.g., silicon (Si)) using a target substance having an amino group as an end group, and then, by photographing the fluorophore using an ultra-high resolution microscope to detect the semiconductor pattern.

According to an exemplary embodiment of the present disclosure a method for fabricating a semiconductor device includes forming a semiconductor pattern including a first layer and a second layer on a substrate, forming a coating layer on a surface of the first layer, forming a dyeing substance in which one of an antibody or a protein is combined with a fluorophore, attaching the dyeing substance to a surface of the coating layer to form a dyeing layer, and photographing the fluorophore with an ultra-high resolution microscope to detect the semiconductor pattern.

According to an exemplary embodiment of the present disclosure, a method for fabricating a semiconductor device includes forming a semiconductor pattern including a silicon oxide layer on a substrate, forming a coating layer having a positive charge on a surface of the silicon oxide layer, forming a dyeing substance in which any one of an antibody having a negative charge and a protein having the negative charge is combined with a fluorophore, attaching the dyeing substance to a surface of the coating layer to form a dyeing layer, and photographing the fluorophore using any one of a STORM (Stochastic Optical Reconstruction Microscopy), a STED (Stimulated Emission Depletion), a SSIM (Saturated Structured Illumination Microscopy), and a PALM (Photo-activated Localization Microscopy) to detect the semiconductor pattern.

According to an exemplary embodiment of the present disclosure, a method for fabricating a semiconductor device includes forming a semiconductor pattern including a silicon layer on a substrate, forming a dyeing layer including a fluorophore on a surface of the silicon layer, and photographing the fluorophore using any one of a STORM (Stochastic Optical Reconstruction Microscopy), a STED (Stimulated Emission Depletion), a SSIM (Saturated Structured Illumination Microscopy), and a PALM (Photoactivated Localization Microscopy) to detect the semiconductor pattern, wherein the dyeing layer is not formed on any portion of the semiconductor pattern other than the surface of the silicon layer.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which:

FIG. 4 is a flowchart for explaining a method for fabricating a semiconductor device according to some embodiments of the present disclosure;

FIG. 7 is a flowchart for explaining the method for fabricating the semiconductor device according to some other embodiments of the present disclosure;

FIG. 9 is a flowchart for explaining the method for fabricating the semiconductor device according to some other embodiments of the present disclosure;

DETAILED DESCRIPTION OF THE EMBODIMENTS

Hereinafter, an ultra-high resolution microscope used in the method for fabricating a semiconductor device according to some embodiments of the present disclosure will be described referring to FIGS. 1 to 3.

Figure 1:
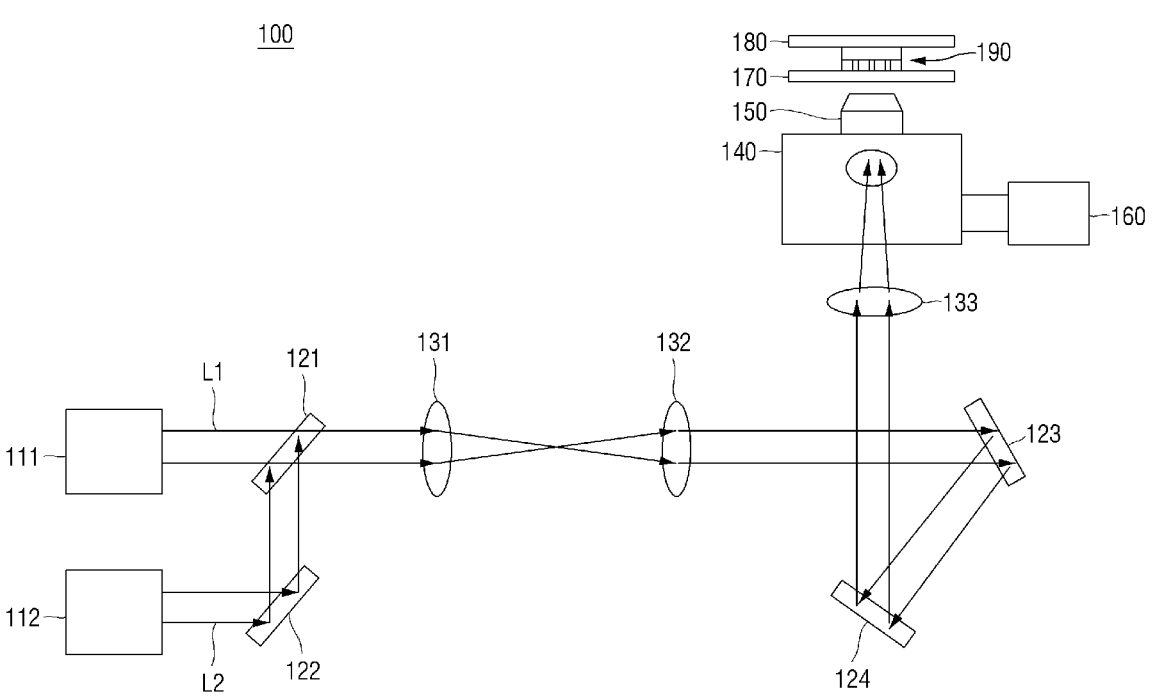
FIGS. 1 and 1a are diagrams for explaining an ultra-high resolution microscope used in a method for fabricating a semiconductor device according to some embodiments of the present disclosure.
Figure 1A:
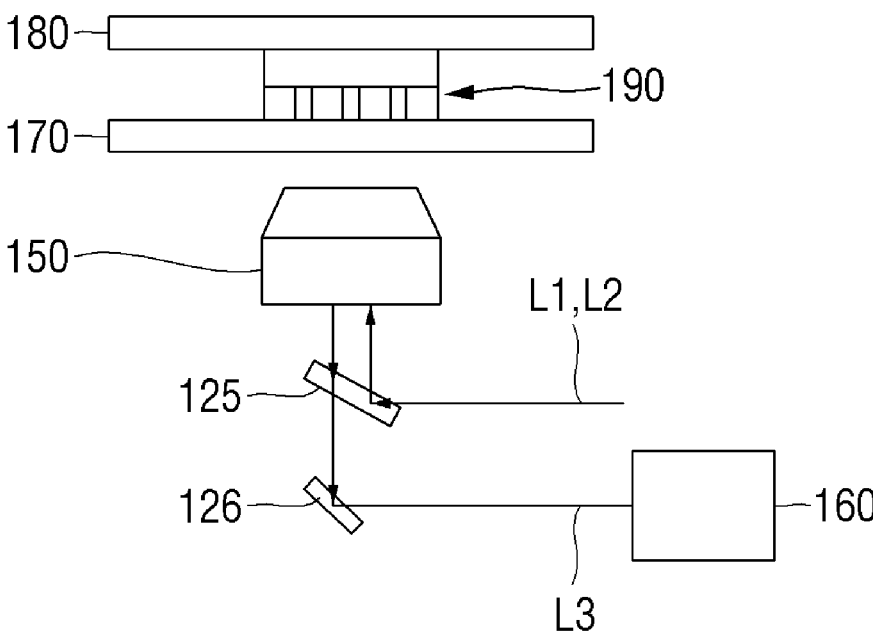
Figure 2:
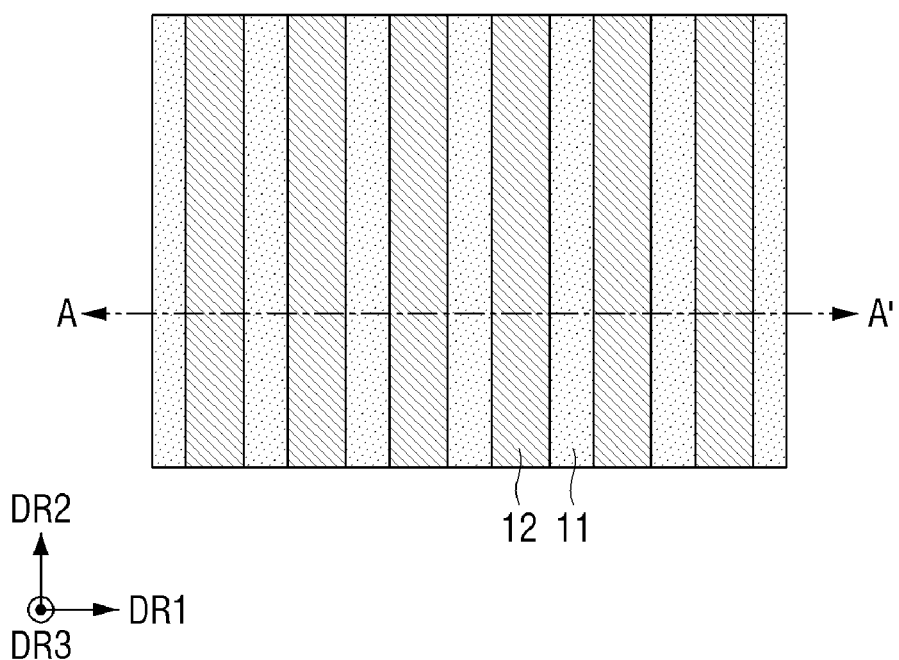
FIG. 2 is a plan view for explaining a semiconductor pattern detected by the method for fabricating the semiconductor device according to some embodiments of the present disclosure.

FIGS. 1 and 1a are diagrams for explaining an ultra-high resolution microscope used in a method for fabricating a semiconductor device according to some embodiments of the present disclosure. FIG. 2 is a plan view for explaining the semiconductor pattern detected by the method for fabricating the semiconductor device according to some embodiments of the present disclosure. FIG. 3 is a cross-sectional view taken along a line A-A' of FIG. 2.

Referring to FIGS. 1 and 1a, an ultra-high resolution microscope 100 used in the method for fabricating a semiconductor device according to some embodiments of the present disclosure may detect a semiconductor pattern of a nanometer level through a spatial resolution in the range of 10 nm to 20 nm.

The ultra-high resolution microscope 100 may be, for example, any one of a STORM (Stochastic Optical Reconstruction Microscopy), a STED (Stimulated Emission Depletion), a SSIM (Saturated Structured Illumination Microscopy), and a PALM (Photoactivated Localization Microscopy). Hereinafter, an example in which the ultra-high resolution microscope 100 is a STORM (Stochastic Optical Reconstruction Microscopy) will be described as an example.

For example, the ultra-high resolution microscope 100 may include a first light source 111, a second light source 112, first and second dichroic mirrors 121 and 125, first to fourth reflection mirrors 122, 123, 124 and 126, first to third lens 131, 132 and 133, a body 140, an objective lens 150, a detector 160, a first cover glass 170, and a second cover glass 180.

The first cover glass 170 may be placed on the body 140. The first cover glass 170 may allow transmission of light. An object 190 may be placed on an upper surface of the first cover glass 170. The object 190 may include a substrate 10 and a semiconductor pattern formed on the substrate 10. The semiconductor pattern may include a first layer 11 and a second layer 12. For example, the semiconductor pattern may include a first layer 11 placed on the substrate 10 and a second layer 12 placed on the first layer 11. The substrate 10 may be a semiconductor, for example silicon.

The first layer 11 and the second layer 12 may include or be formed of different substances from each other. In some embodiments, the first layer 11 may be a silicon oxide layer including silicon oxide ($SiO_2$), and the second layer 12 may be a silicon layer including silicon (Si). In some other embodiments, the first layer 11 may be a silicon oxide layer including silicon oxide ($SiO_2$), and the second layer 12 may include other substances other than silicon oxide ($SiO_2$). In still some other embodiments, the second layer 12 is a silicon layer including silicon (Si), and the first layer 11 may include other substances other than silicon (Si).

For example, the semiconductor pattern of the object 190 may be placed to face the upper surface of the first cover glass 170. However, the present disclosure is not limited thereto. In some other embodiments, the substrate of the object 190 may be placed to face the upper surface of the first cover glass 170.

The second cover glass 180 may be placed on the upper surface of the first cover glass 170. The second cover glass 180 may be placed to cover the object 190. The objective lens 150 may be placed between the body 140 and the first cover glass 170. The objective lens 150 may collect the light that has passed through the body 140 and may output the light toward the object 190.

The first light source 111 may provide a first light L1 to the body 140. The first light L1 may be, for example, a laser having a wavelength of 647 nm. The second light source 112 may provide a second light L2 to the body 140. For example, the wavelength of the second light L2 may be smaller than the wavelength of the first light L1. The second light L2 may be, for example, a laser having a wavelength of 405 nm.

The first light L1 provided from the first light source 111 may sequentially pass through a first dichroic mirror 121, a first lens 131, and a second lens 132, reflect off a second reflection mirror 123 and a third reflection mirror 124, pass through and a third lens 133, and may be provided to the body 140. The second optical L2 provided from the second light source 112 may sequentially reflect off the first reflection mirror 122, the first dichroic mirror 121, pass through the first lens 131 and the second lens 132, reflect off the second reflection mirror 123 and the third reflection mirror 124, pass through the third lens 133, and may be provided to the body 140. A movement path of the first light L1 and the second light L2 shown in FIGS. 1 and 1a is an example, and the present disclosure is not limited thereto.

The first light L1 and the second light L2 provided to the body 140 may sequentially reflect off the second dichroic mirror 125, pass through the objective lens 150 and the first cover glass 170, and may be provided to the object 190. The first light L1 and the second light L2 provided to the object 190 may excite a fluorophore (e.g., 16 of FIG. 6) formed on the surface of the semiconductor pattern of the object 190.

Figure 6:
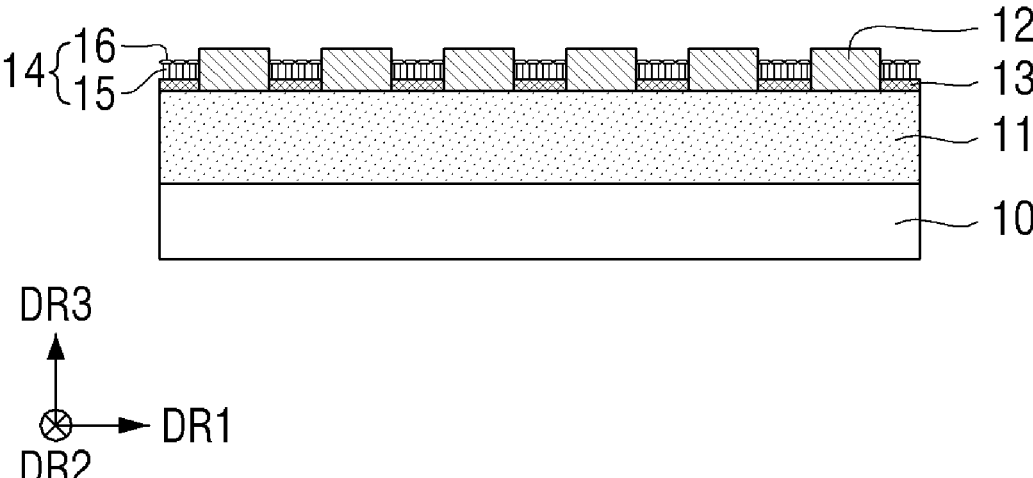

For example, the first light L1, which in one embodiment is a laser having a wavelength of 647 nm, may primarily excite the fluorophore (e.g., 16 of FIG. 6). Next, after a certain period of time passes, the second light L2, which in one embodiment is a laser having a wavelength of 405 nm, may secondarily excite the fluorophore (e.g., 16 of FIG. 6). The fluorophore (e.g., 16 of FIG. 6) may be repeatedly excited through the first light L1 and the second light L2.

A fluorescence L3 (e.g., third light) generated from the fluorophore (e.g., 16 of FIG. 6) excited through the first light L1 and the second light L2 may be provided to the body 140. Next, the fluorescence L3 may pass through the second dichroic mirror 125 placed inside the body 140, then may be reflected by the fourth reflection mirror 126, and provided to the detector 160. The detector 160 may detect the semiconductor pattern of the object 190, using the provided fluorescence L3. For example, the semiconductor pattern of the object 190 may be detected by photographing the fluorophore (e.g., 16 of FIG. 6) using the ultra-high resolution microscope 100.

Hereinafter, a method for fabricating a semiconductor device according to some embodiments of the present disclosure will be described referring to FIGS. 1, 1a, and 3 to 6.

Figure 5:
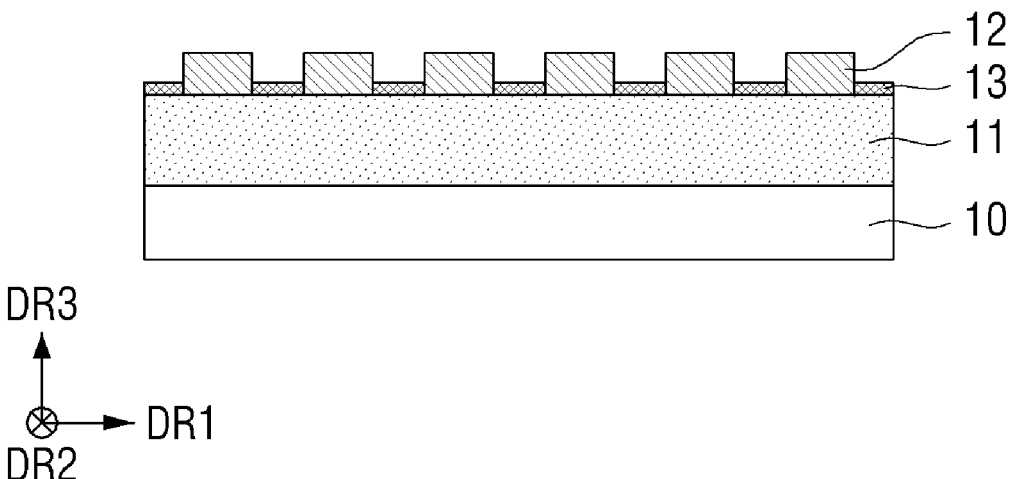
FIGS. 5 and 6 are intermediate step diagrams for explaining a method for fabricating a semiconductor device according to some embodiments of the present disclosure shown in FIG. 4.

FIG. 4 is a flowchart for explaining a method for fabricating a semiconductor device according to some embodiments of the present disclosure. FIGS. 5 and 6 are intermediate step diagrams for explaining a method for fabricating a semiconductor device according to some embodiments of the present disclosure shown in FIG. 4.

Figure 3:
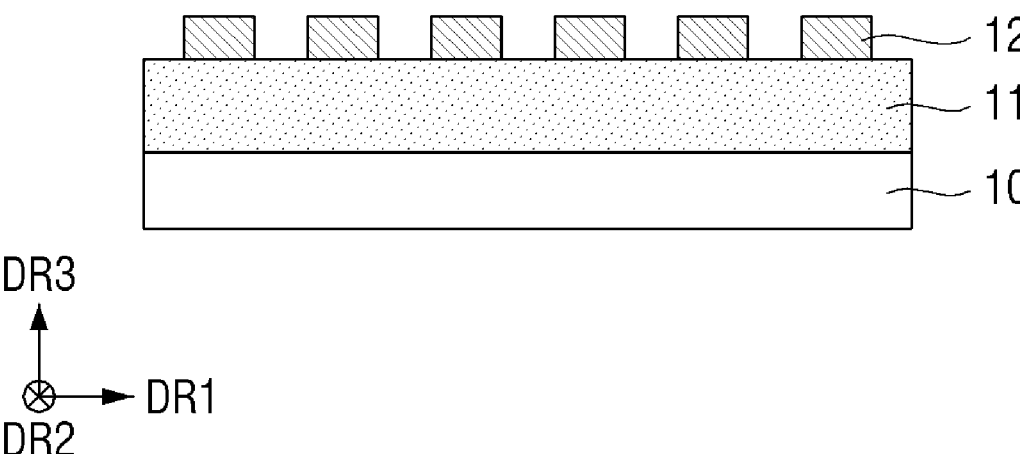
FIG. 3 is a cross-sectional view taken along a line A-A' of FIG. 2.

Referring to FIGS. 3 and 4, a semiconductor pattern including the first layer 11 which is a silicon oxide layer and the second layer 12 formed on the first layer 11 may be formed on the substrate 10 (S110). For example, the surface of the first layer 11 may have a negative charge. The second layer 12 may include substances other than silicon oxide (SiO$_2$), such as a metal, or silicon, for example.

For example, the second layer 12 may form patterns separated from each other in a first horizontal direction DR1. The second layer 12 may extend in a second horizontal direction DR2 different from the first horizontal direction DR1. The second layer 12 may protrude from the first layer 11 in a vertical direction DR3 perpendicular to each of the first and second horizontal directions DR1 and DR2. The shape of the semiconductor pattern including the first layer 11 and the second layer 12 is an example, and the shape of the semiconductor pattern is not limited as such.

Subsequently, the semiconductor pattern including the first layer 11 and the second layer 12 may be cleaned. For example, the semiconductor pattern including the first layer 11 and the second layer 12 may be cleaned with acetone, but the present disclosure is not limited thereto. After that, the semiconductor pattern including the cleaned first layer 11 and second layer 12 may be dried.

Referring to FIGS. 4 and 5, a coating layer 13 having a positive charge may be formed on the surface of the first layer 11 which is a silicon oxide layer (S120). For example, the surface of the first layer 11 has a negative charge. For example, the coating layer 13 may be formed on the upper surface of the first layer 11 which is a silicon oxide layer between the second layers 12. The coating layer 13 may not be formed on a portion other than the surface of the first layer 11 which is a silicon oxide layer. The coating layer 13 may include or may be, for example, a polymer such as poly-L-lysine.

Referring to FIGS. 4 and 6, the antibody 15 and the fluorophore 16 having a negative charge may be combined to form a dyeing substance (S130). The antibody 15 may have a negative charge. The dyeing substance formed by combining the antibody 15 and the fluorophore 16 may also have a negative charge.

The antibody 15 may be, for example, any one of a monoclonal antibody, a polyclonal antibody, a fragment antigen binding, a camel heavy-chain antibody, and a nanobody. However, the present disclosure is not limited thereto. The fluorophore 16 may be, for example, ALEXA FLUOR® 647. However, the present disclosure is not limited thereto.

Next, the dyeing substance formed by combining the antibody 15 and the fluorophore 16 adheres to the surface of the coating layer 13, and a dyeing layer 14 may be formed (S140). For example, the dyeing layer 14 may be formed on the upper surface of the coating layer 13 between the second layers 12. The antibody 15 of the dyeing substance may adhere to the upper surface of the coating layer 13. In this case, the antibody 15 having negative charge may easily adhere to the coating layer 13 having positive charge. The dyeing layer 14 may not be formed on a portion other than the surface of the first layer 11 which is a silicon oxide layer. For example, a dyeing layer 14 including the fluorophore 16 may be selected that has an affinity to adhere to the coating layer 13 formed on the first layer 11, but not the material that forms the second layer 12. This may be accomplished through the use of a coating layer 13 that has a positive charge, and which adheres to the first layer 11 (which, for example, may be SiO$_2$ having a negative charge), but does not adhere to the material that forms the second layer 12 (which may have no charge or a positive charge), and then selecting the antibody 15 having the negative charge, which adheres to the coating layer 13.

Referring to FIGS. 1, and 1a, a buffer solution may be provided on the upper surface of the first cover glass 170. This step is not shown in FIG. 4, and can occur at any time prior to step S150 of FIG. 4. For example, the buffer solution may have a refractive index of 1.45. The buffer solution may be, for example, a solution obtained by mixing Tris 8.0 solution with glucose oxidase, sucrose, glucose, catalase and cysteamine (MEA). However, the present disclosure is not limited thereto.

Subsequently, the semiconductor pattern formed on the substrate 10 may be detected using the ultra-high resolution microscope 100 (S150). For example, the object 190 (the substrate 10 on which the semiconductor pattern is formed) may be placed on the upper surface of the first cover glass 170 so that the dyeing layer 14 faces the upper surface of the first cover glass 170.

Subsequently, after the substrate 10 on which the semiconductor pattern is formed is covered with the second cover glass 180, and the first light L1 and second light L2 are provided to the object 190 to excite the fluorophore 16, the fluorophore 16 may be photographed, using the ultra-high resolution microscope 100. The detector 160 may be provided with the fluorescence L3 generated from the fluorophore 16 excited by the first light L1 and the second light L2. The detector 160 may detect the semiconductor pattern of the object 190, using the provided fluorescence L3.

The method for fabricating a semiconductor device according to some embodiments of the present disclosure may effectively detect the semiconductor pattern of the nanometer level, by selectively attaching the fluorophore 16 onto the surface of the layer 11 including a target substance (e.g., silicon oxide (SiO$_2$)) using the antibody 15, and then by photographing the fluorophore 16 with the ultra-high resolution microscope 100 to detect the semiconductor pattern. After the photographing, the dyeing layer 14 may be removed, and a subsequent step in the manufacturing process may be performed. For example, the photographing may be part of a step in the manufacturing process that checks for defects in the product being manufactured. For example, after a particular deposition or etching step that forms a pattern of or on silicon oxide SiO$_2$, the above method may be carried out to detect any defects in the pattern. If the pattern is determined to be defect-free, then after removing the dyeing layer 14, the next step in the manufacturing process may be carried out (e.g., deposition of a further layer, additional etching, etc.). A completed semiconductor device will be formed after all layers in the manufacturing process are complete, resulting, for example, in an integrated circuit on a die, which forms a memory or logic chip. If the pattern is determined to have defects, either a process that corrects the defects maybe carried out, or the device being manufactured may be discarded.

Hereinafter, a method for fabricating a semiconductor device according to some other embodiments of the present disclosure will be described referring to FIGS. 7 and 8.

Differences from the method for fabricating the semiconductor device shown in FIGS. 3 to 6 will be mainly described.

FIG. 7 is a flowchart for explaining the method for fabricating the semiconductor device according to some other embodiments of the present disclosure. FIG. 8 is an intermediate step diagram for explaining the method for fabricating the semiconductor device according to some other embodiments of the present disclosure shown in FIG. 7.

Figure 8:
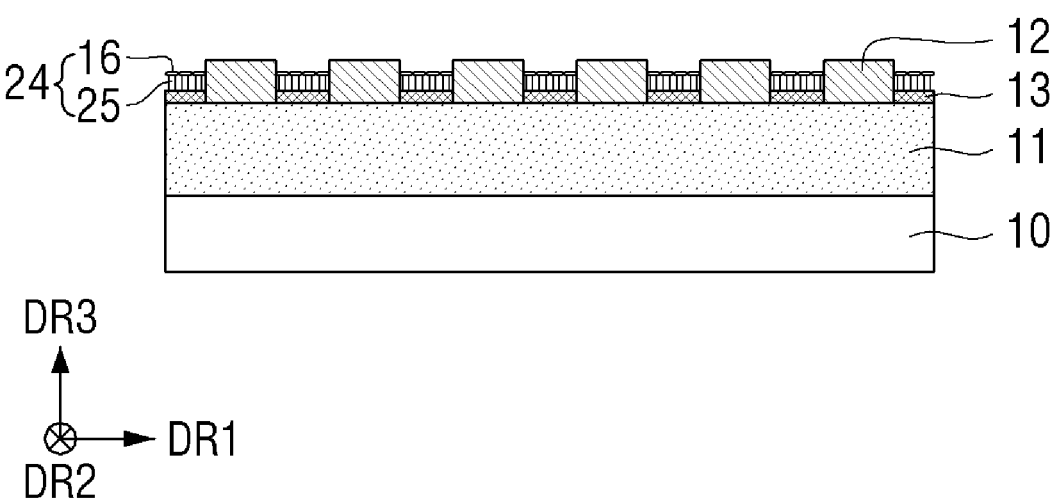
FIG. 8 is an intermediate step diagram for explaining a method for fabricating a semiconductor device according to some other embodiments of the present disclosure shown in FIG. 7.

Referring to FIGS. 7 and 8, the method for fabricating the semiconductor device according to some other embodiments of the present disclosure may combine the protein 25 and the fluorophore 16 having negative charge to form the dyeing substance.

Specifically, after the semiconductor pattern including the first layer 11 which is a silicon oxide layer and the second layer 12 formed on the first layer 11 is formed on the substrate 10 (S110), a coating layer 13 having the positive charge may be formed on the surface of the first layer 11 which is the silicon oxide layer (S120). The coating layer 13 may include or may be, for example, a polymer such as poly-L-lysine.

Next, the protein 25 and the fluorophore 16 having negative charge may be combined to form the dyeing substance (S230). The protein 25 may have the negative charge. The dyeing substance formed by combining the protein 25 and the fluorophore 16 may also have the negative charge. The protein may be, for example, a BSA (Bovine Serum Albumin) protein. However, the present disclosure is not limited thereto.

Subsequently, the dyeing substance formed by combining the protein 25 and the fluorophore 16 may adhere to the surface of the coating layer 13 to form the dyeing layer 24 (S140). For example, the dyeing layer 24 may be formed on the upper surface of the coating layer 13 between the second layers 12. The protein 25 of the dyeing substance may adhere to the upper surface of the coating layer 13. In this case, the protein 25 having the negative charge may easily adhere to the coating layer 13 having the positive charge. The dyeing layer 24 may not be formed on a portion other than the surface of the first layer 11 which is a silicon oxide layer.

The buffer solution may then be provided on the upper surface of the first cover glass (170 of FIG. 1). Next, the object (190 of FIG. 1) (the substrate 10 having the semiconductor pattern formed thereon) may be positioned on the upper surface of the first cover glass (170 of FIG. 1) so that the dyeing layer 24 faces the upper surface of the first cover glass (170 of FIG. 1). Subsequently, the semiconductor pattern formed on the substrate 10 may be detected, using an ultra-high resolution microscope (100 of FIG. 1) (S150).

The method for fabricating a semiconductor device according to some other embodiments of the present disclosure may effectively detect the semiconductor pattern of the nanometer level, by selectively attaching the fluorophore 16 onto the surface of the layer 11 including the target substance (e.g., silicon oxide ($SiO_2$)) using the protein 25, and then by photographing the fluorophore 16 with the ultra-high resolution microscope 100 to detect the semiconductor pattern.

Hereinafter, a method for fabricating a semiconductor device according to still some other embodiments of the present disclosure will be described referring to FIGS. 9 to 11. Differences from the method for fabricating the semiconductor device shown in FIGS. 3 to 6 will be mainly described.

FIG. 9 is a flowchart for explaining the method for fabricating the semiconductor device according to some other embodiments of the present disclosure. FIGS. 10 and 11 are intermediate step diagrams for explaining the method for fabricating the semiconductor device according to still other embodiments of the present disclosure shown in FIG. 9.

Figure 10:
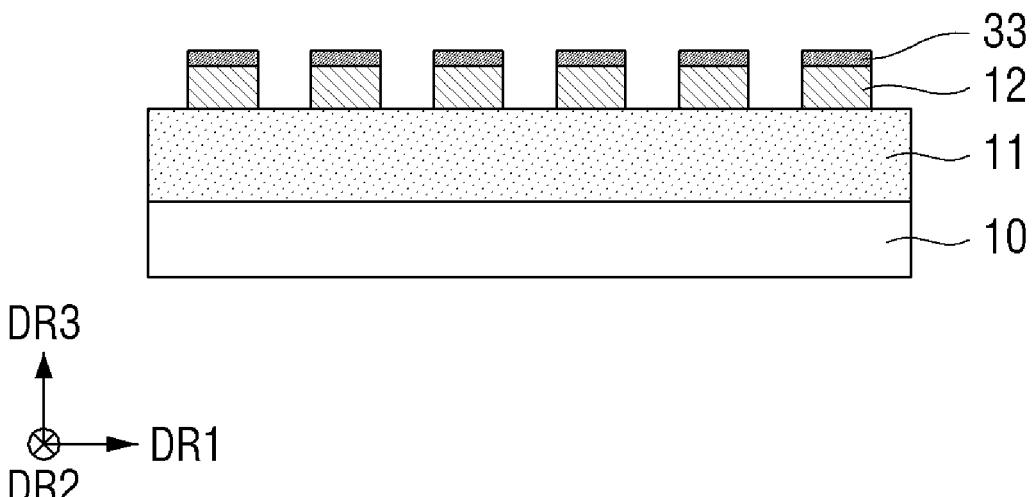
FIGS. 10 and 11 are intermediate step diagrams for explaining a method for fabricating a semiconductor device according to still other embodiments of the present disclosure shown in FIG. 9.
Figure 11:
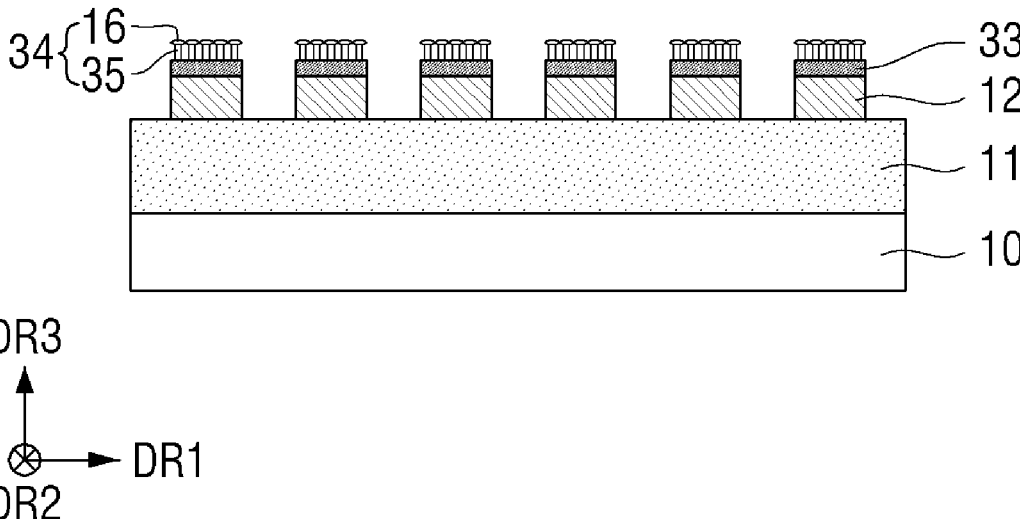

Referring to FIGS. 9 to 11, the method for fabricating the semiconductor device according to still some other embodiments of the present disclosure may detect the semiconductor pattern including the first layer 11 and the second layer 12 which is a silicon layer, using the dyeing substance formed by combining any one 35 of the antibody or the protein and the fluorophore 16.

Specifically, referring to FIGS. 9 and 10, a semiconductor pattern including the first layer 11 and the second layer 12 formed on the first layer 11 may be formed on the substrate 10 (S310). The first layer 11 may be a silicon oxide layer including silicon oxide ($SiO_2$), and the second layer 12 may be a silicon layer including silicon (Si). In some other embodiments, the second layer 12 is a silicon layer including silicon (Si), and the first layer 11 may include other substances other than silicon (Si).

Subsequently, the semiconductor pattern including the first layer 11 and the second layer 12 may be cleaned. For example, the semiconductor pattern including the first layer 11 and the second layer 12 may be cleaned with acetone, but the present disclosure is not limited thereto. After that, the semiconductor pattern including the cleaned first layer 11 and second layer 12 may be dried.

Subsequently, a coating layer 33 having the negative charge may be formed on the surface of the second layer 12, which is a silicon layer (S320). In FIG. 10, for convenience of explanation, although the coating layer 33 is shown as being formed only on the upper surface of the second layer 12 which is a silicon layer, the coating layer 33 may also be formed on the side walls of the second layer 12 which is a silicon layer. The coating layer 33 may include negatively charged polymers, for example, a sulfonated tetrafluoroethylene based fluoropolymer-copolymer, such as NAFION®. For example, the coating layer 33 may have an affinity to adhere to silicon but not the material that forms the first layer 11.

After that, the coating layer 33 may be dried. After that, the coating layer 33 may be cleaned. For example, the coating layer 33 may be cleaned, using Dulbecco's phosphate buffer saline (DPBS).

Referring to FIGS. 9 and 11, any one 35 of the antibody or protein and the fluorophore 16 may be combined to form the dyeing substance (S330). That is, the dyeing substance may be formed by combining the antibody with the fluorophore 16 or combining the protein with the fluorophore 16.

The antibody may be, for example, any one of a monoclonal antibody, polyclonal antibody, fragment antigen binding, camel heavy-chain antibody, and nanobody. The protein may be, for example, a BSA (Bovine Serum Albumin) protein. The fluorophore 16 may be, for example, ALEXA FLUOR® 647.

Next, a dyeing substance formed by combining any one 35 of the antibody or protein and the fluorophore 16 may adhere to the surface of the coating layer 33 to form the dyeing layer 34 (S340). Although FIG. 11 shows that the dyeing layer 34 is shown as being formed only on the upper surface of the coating layer 33 for convenience of explanation, the dyeing layer 34 may also be formed on the side walls of the coating layer 33. Any one 35 of the antibody and the protein of the dyeing substance may adhere to the upper surface of the coating layer 33. The dyeing layer 34 may not be formed on a portion other than the surface of the second layer 12, which is a silicon layer.

The buffer solution may then be provided onto the upper surface of the first cover glass (170 of FIG. 1). Next, the object (190 of FIG. 1) (the substrate 10 having the semiconductor pattern formed thereon) may be located on the upper surface of the first cover glass (170 of FIG. 1) so that the dyeing layer 34 faces the upper surface of the first cover glass (170 of FIG. 1). Subsequently, the semiconductor pattern formed on the substrate 10 may be detected, using an ultra-high resolution microscope (100 of FIG. 1) (S350).

The method for fabricating a semiconductor device according to still some other embodiments of the present disclosure may effectively detect the semiconductor pattern of the nanometer level, by selectively attaching the fluorophore 16 onto the surface of layer 12 including a target substance (e.g., silicon (Si)) using any one 35 of the antibody and protein, and then by photographing the fluorophore 16 with an ultra-high resolution microscope 100 to detect the semiconductor pattern.

Hereinafter, a method for fabricating a semiconductor device according to some other embodiments of the present disclosure will be described referring to FIGS. 12 to 15. Differences from the method for fabricating the semiconductor device shown in FIGS. 3 to 6 will be mainly described.

Figure 12:
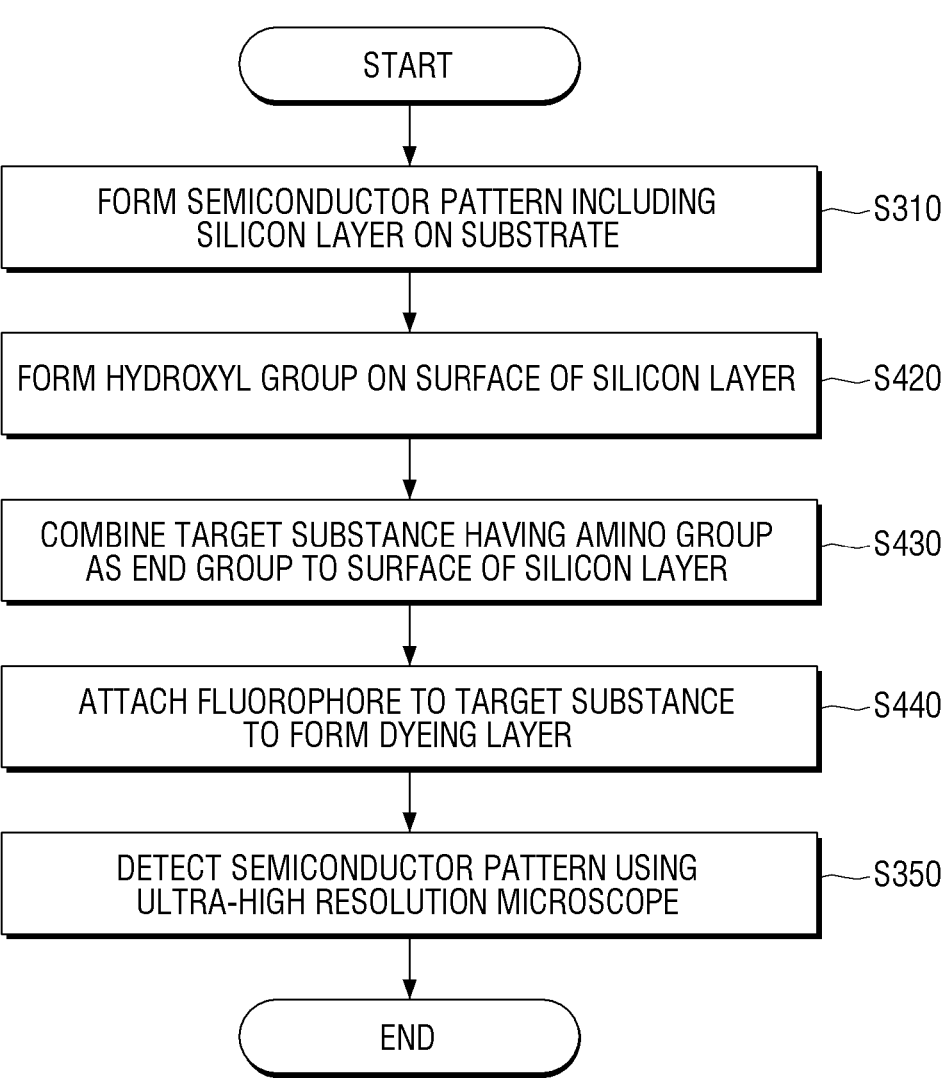
FIG. 12 is a flowchart for explaining a method for fabricating a semiconductor device according to still some other embodiments of the present disclosure.
Figure 13:
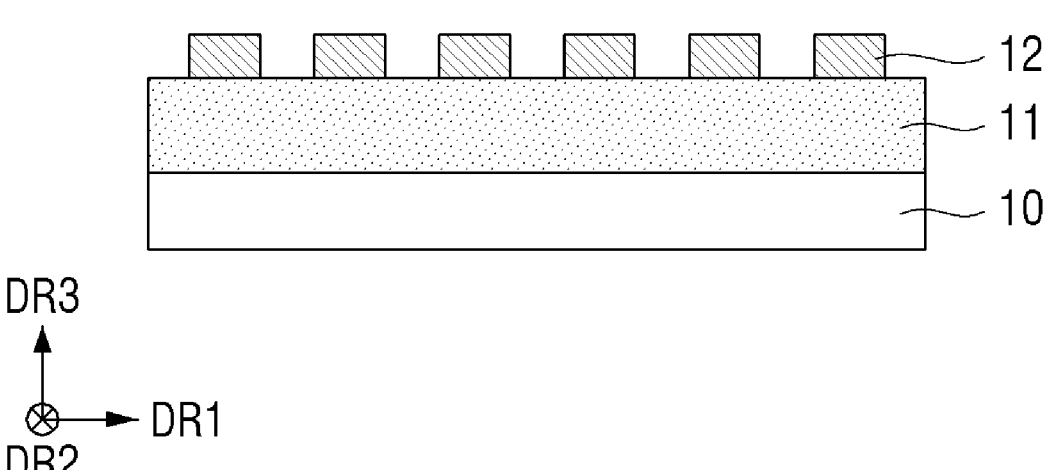
FIGS. 13 to 15 are intermediate step diagrams for explaining a method for fabricating a semiconductor device according to still some embodiments of the present disclosure shown in FIG. 12.
Figure 14:
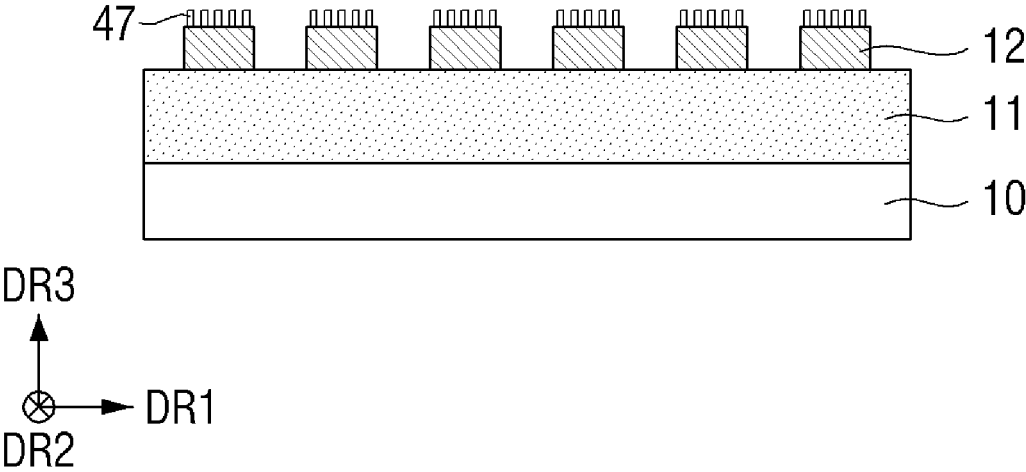
Figure 15:
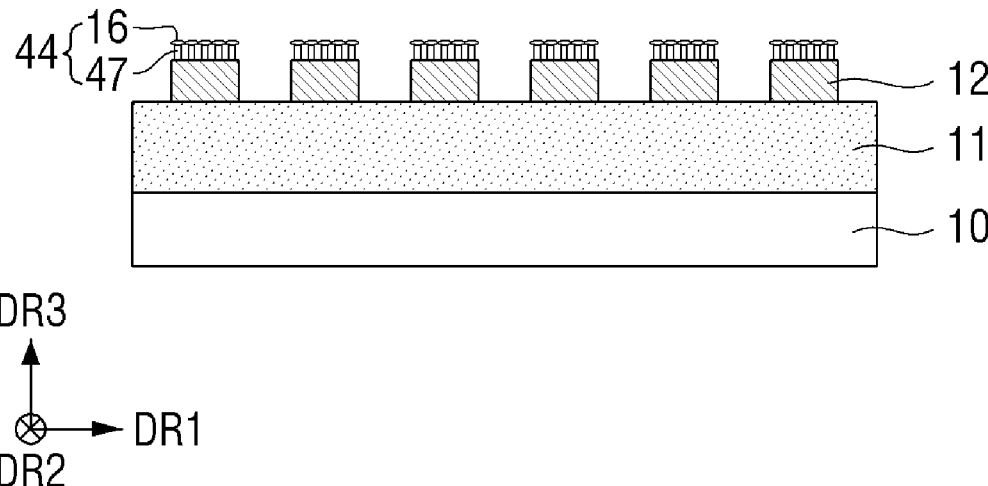

FIG. 12 is a flowchart for explaining a method for fabricating a semiconductor device according to still some other embodiments of the present disclosure. FIGS. 13 to 15 are intermediate step diagrams for explaining a method for fabricating a semiconductor device according to still some embodiments of the present disclosure shown in FIG. 12.

Referring to FIGS. 12 to 15, the method for fabricating the semiconductor device according to still some other embodiments of the present disclosure may detect a semiconductor pattern including the second layer 12, which is a silicon layer, using the dyeing substance formed by combining the target substance 47 having an amino group as an end group and the fluorophore 16.

Specifically, referring to FIGS. 12 and 13, a semiconductor pattern including the second layer 12 formed on the first layer 11 may be formed on the substrate 10 (S310). The first layer 11 may be a silicon oxide layer including silicon oxide ($SiO_2$), and the second layer 12 may be a silicon layer including silicon (Si). In some other embodiments, the second layer 12 is a silicon layer including silicon (Si), and the first layer 11 may include other substances other than silicon (Si).

Subsequently, a hydrophilic hydroxyl group may be formed on the surface of the second layer 12 which is a silicon layer (S420). For example, by performing a cleaning process using oxygen plasma on the surface of the second layer 12 which is a silicon layer, a hydrophilic hydroxyl group may be formed on the surface of the second layer 12 which is a silicon layer.

Referring to FIGS. 12 and 14, a target substance 47 having an amino group as an end group may be combined to the surface of the second layer 12, which is a silicon layer (S430). In FIG. 14, for convenience of explanation, although the target substance 47 is shown as being combined only to the upper surface of the second layer 12 which is a silicon layer, the target substance 47 may also be combined to the side walls of the second layer 12 which is a silicon layer.

The target substance 47 may include, for example, APTES ((3-aminopropyl)triethoxysilane). The ethoxy group of APTES ((3-aminopropyl)triethoxysilane) may be combined to the hydroxyl group on the surface of the second layer 12, which is the silicon layer. As a result, the end group of the target substance 47 combined to the surface of the second layer 12 which is a silicon layer may be formed as an amino group.

Subsequently, the surface of the second layer 12, which is a silicon layer, may be heated and cured. For example, the surface of the second layer 12, which is a silicon layer having an amino group as an end group, may be heated to about 110° C. and cured.

Referring to FIGS. 12 and 15, the fluorophore 16 may adhere to the target substance 47 to form a dyeing layer 44. For example, the fluorophore 16 may be fixed to the target substance 47, using glutaraldehyde.

In FIG. 15, for convenience of explanation, although the dyeing layer 44 is shown as being formed only on the upper surface of the second layer 12 which is a silicon layer, the dyeing layer 44 may also be formed on the side walls of the second layer 12 which is a silicon layer. The dyeing layer 44 may not be formed on a portion other than the surface of the second layer 12, which is a silicon layer. For example, the dyeing layer 44 (e.g., the target substance 47) may have an affinity to adhere to the second layer 12 (e.g., silicon) but not the first layer 11.

The buffer solution may then be provided onto the upper surface of the first cover glass (170 of FIG. 1). Next, the object (190 of FIG. 1) (the substrate 10 having the semiconductor pattern formed thereon) may be positioned on the upper surface of the first cover glass (170 of FIG. 1) so that the dyeing layer 44 faces the upper surface of the first cover glass (170 of FIG. 1). Subsequently, the semiconductor pattern formed on the substrate 10 may be detected, using the ultra-high resolution microscope (100 of FIG. 1) (S350).

The method for fabricating the semiconductor device according to still some other embodiments of the present disclosure may effectively detect the semiconductor pattern of a nanometer level, by selectively attaching the fluorophore 16 onto the surface of the layer 12 including the target substance (e.g., silicon (Si)) using the target substance 47 having an amino group as an end group, and then by photographing the fluorophore 16 with an ultra-high resolution microscope 100.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A method for fabricating a semiconductor device, the method comprising:

forming a semiconductor pattern including a first layer and a second layer on a substrate;

forming a coating layer on a surface of the first layer;

forming a dyeing substance in which one of an antibody or a protein is combined with a fluorophore;

attaching the dyeing substance to a surface of the coating layer to form a dyeing layer; and photographing the fluorophore with an ultra-high resolution microscope to detect the semiconductor pattern, wherein the first layer is a silicon oxide layer between the substrate and the second layer.

2. The method for fabricating the semiconductor device of claim 1, wherein the coating layer includes poly-L-lysine.

3. The method for fabricating the semiconductor device of claim 1, wherein the coating layer includes a sulfonated tetrafluoroethylene based fluoropolymer-copolymer.

4. The method for fabricating the semiconductor device of claim 1, wherein the antibody is any one of a monoclonal antibody, a polyclonal antibody, a fragment antigen binding, a camel heavy-chain antibody, or a nanobody.

5. The method for fabricating the semiconductor device of claim 1, wherein the protein is a BSA (Bovine Serum Albumin) protein.

6. The method for fabricating the semiconductor device of claim 1, wherein the fluorophore is ALEXA FLUOR® 647.

7. The method for fabricating the semiconductor device of claim 1, wherein the ultra-high resolution microscope is any one of a STORM (Stochastic Optical Reconstruction Microscopy), a STED (Stimulated Emission Depletion), a SSIM (Saturated Structured Illumination Microscopy), or a PALM (Photoactivated Localization Microscopy).

8. The method for fabricating the semiconductor device of claim 1, wherein the coating layer and the dyeing layer are not formed on a portion other than the surface of the first layer.

9. The method for fabricating a semiconductor device of claim 1, wherein:

the coating layer has a positive charge, and the antibody has a negative charge or the protein has a negative charge; and wherein the ultra-high resolution microscope is any one of a STORM (Stochastic Optical Reconstruction Microscopy), a STED (Stimulated Emission Depletion), a SSIM (Saturated Structured Illumination Microscopy), or a PALM (Photoactivated Localization Microscopy) to detect the semiconductor pattern.

10. A method for fabricating a semiconductor device, the method comprising:

forming a semiconductor pattern including a silicon layer on a substrate;

forming a dyeing layer including a fluorophore on a surface of the silicon layer; and photographing the fluorophore using any one of a STORM (Stochastic Optical Reconstruction Microscopy), a STED (Stimulated Emission Depletion), a SSIM (Saturated Structured Illumination Microscopy), or a PALM (Photoactivated Localization Microscopy) to detect the semiconductor pattern, wherein the forming of the dyeing layer includes:

forming a coating layer on the surface of the silicon layer, forming a dyeing substance in which any one of an antibody or a protein is combined with the fluorophore, and attaching the dyeing substance to a surface of the coating layer to form the dyeing layer.

11. The method for fabricating the semiconductor device of claim 10, wherein the coating layer includes poly-L-lysine.

12. The method for fabricating the semiconductor device of claim 10, wherein the antibody is any one of a monoclonal antibody, a polyclonal antibody, a fragment antigen binding, a camel heavy-chain antibody, and a nanobody.

13. The method for fabricating the semiconductor device of claim 10, wherein the protein is a BSA (Bovine Serum Albumin) protein.

14. The method for fabricating the semiconductor device of claim 10, wherein the dyeing layer is not formed on any portion of the semiconductor pattern other than the surface of the silicon layer.

15. The method for fabricating the semiconductor device of claim 10, wherein the coating layer includes a sulfonated tetrafluoroethylene based fluoropolymer-copolymer.

16. A method for fabricating a semiconductor device, the method comprising:

forming a semiconductor pattern including a silicon layer on a substrate;

forming a dyeing layer including a fluorophore on a surface of the silicon layer; and photographing the fluorophore using any one of a STORM (Stochastic Optical Reconstruction Microscopy), a STED (Stimulated Emission Depletion), a SSIM (Saturated Structured Illumination Microscopy), or a PALM (Photoactivated Localization Microscopy) to detect the semiconductor pattern, wherein the forming of the dyeing layer includes:

forming a hydroxyl group on the surface of the silicon layer, combining a target substance having an amino group as an end group to the surface of the silicon layer, and attaching the fluorophore to the target substance to form the dyeing layer.

17. The method for fabricating the semiconductor device of claim 16, wherein the forming of the hydroxyl group on the surface of the silicon layer includes:

performing a cleaning process on the surface of the silicon layer, using an oxygen plasma.

18. The method for fabricating the semiconductor device of claim 16, wherein the combination of the target substance having the amino group as the end group to the surface of the silicon layer includes:

combining APTES ((3-Aminopropanol)triethoxysilane) to the hydroxyl group formed on the surface of the silicon layer, and heating and curing the surface of the silicon layer.

\* \* \* \* \*